(12) United States Patent
Taniguchi et al.

(10) Patent No.: US 6,232,663 B1
(45) Date of Patent: *May 15, 2001

(54) SEMICONDUCTOR DEVICE HAVING INTERLAYER INSULATOR AND METHOD FOR FABRICATING THEREOF

(75) Inventors: Toshio Taniguchi; Kenji Nukui, both of Kuwana (JP); Ibrahim Burki, Sunnyvale, CA (US); Richard Huang, Sunnyvale, CA (US); Simon Chan, Sunnyvale, CA (US); Kazunori Imaoka; Kazutoshi Mochizuki, both of Aizuwakamatsu (JP)

(73) Assignees: Fujitsu Limited, Kawasaki (JP); Advanced Micro Devices, Inc., Sunnyvale, CA (US); Fujitsu AMD, Semiconductor Limited, Fukushima (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/904,630

(22) Filed: Aug. 1, 1997

(30) Foreign Application Priority Data

Dec. 13, 1996 (JP) .................................................. 8-334141

(51) Int. Cl.[7] ............................ H01L 23/48; H01L 23/52; H01L 29/40
(52) U.S. Cl. ........................ 257/758; 257/760; 257/649; 257/640
(58) Field of Search ................................. 257/758, 635, 257/637, 639, 649, 640, 760; 438/618, 624, 637

(56) References Cited

U.S. PATENT DOCUMENTS

| 3,967,310 | * | 6/1976 | Horiuchi et al. | 257/637 |
| 4,135,954 | * | 1/1979 | Chang et al. | 257/374 |
| 4,543,707 | * | 10/1985 | Ito et al. | 29/578 |
| 4,902,377 | * | 2/1990 | Berglund et al. | 257/774 |
| 4,972,251 | * | 11/1990 | Lehrer | 257/637 |
| 4,978,636 | * | 12/1990 | Jackson | 257/637 |
| 5,429,995 | * | 7/1995 | Nishiyama et al. | 437/238 |
| 5,523,616 | * | 6/1996 | Den | 257/758 |

* cited by examiner

Primary Examiner—Olik Chaudhuri
Assistant Examiner—Phat X. Cao
(74) Attorney, Agent, or Firm—Armstrong, Westerman, Hattori, McLeland, & Naughton, LLP

(57) ABSTRACT

A semiconductor device and a method of fabricating thereof, including an insulator layer having alternately layered insulator films and boundary layers, wherein the boundary layers are more dense than the insulator films to prevent expansion and elongation of string-like defects across the boundary layers. The method includes mixing a nitrogen containing gas and a silane group gas to form an insulator film; temporarily stopping a flow of the silane group gas for approximately one to fifteen seconds to form a boundary layer over the insulator film; restarting the flow of the silane group gas; and repeating the steps of temporarily stopping and restarting for a predetermined number of times to form the plurality of alternately layered insulator films and boundary layers. The plurality of alternately layered insulator films and boundary layers is also etched at an etching rate for the insulator films greater than an etching rate for the boundary layers to form a step-shaped sloped opening.

11 Claims, 17 Drawing Sheets

SEMICONDUCTOR DEVICE HAVING INTERLAYER INSULATOR AND METHOD FOR FABRICATING THEREOF

BACKGROUND OF THE INVENTION

1. Field of the Invention

This invention generally relates to highly integrated semiconductor devices (IC or LSI) having an interlayer insulator. In particular, the present invention is directed to a technique for acquiring a higher reliability interlayer insulator (inter metal dielectric) and an improvement in forming via contact holes in a semiconductor device.

2. Description of the Related Art

Commonly, conductive layers of semiconductor devices have been fabricated with the following method. An interlayer insulator is deposited on the surface of a patterned metal interconnect. Via contact holes are opened into the interlayer insulator by anisotropic etching to expose the metal interconnect at the bottom of the via contact holes. An aluminum-containing conductive material is then deposited over the interlayer insulator, also filling the inside of the via contact holes. Quite frequently, the electrical connection between one metal layer and another metal area is formed by the above described method.

Recently, 64M bit DRAMs, 256M bit DRAMs, and higher integrated circuits have appeared. However, while the density of semiconductor devices is increasing, semiconductor fabricating processes still employ a conventional conductive layer forming method, such as the method stated above. In the conventional method, the aluminum containing conductive material is very likely to be easily cut at an edge or bottom portion of the via contact hole during the fabricating process or during normal use, due to its thinner aluminum formation. Isotropic etching, followed by an anisotropic etching step, is frequently used as a solution to this problem by opening a via contact hole so as to make a gentle slope near the edge of a via contact hole. Such a contact hole opening technique is disclosed in detail in Japanese Laid-open Patent Sho 56-90523 and its counterpart U.S. Pat. No. 4,352,724.

When adopting the above-identified contact hole opening technique (hereinafter called isotropic-anisotropic etching), a wet etchant is conventionally used for the isotropic etching step. On the other hand, the interlayer insulator to be isotropically etched is frequently formed by a chemical vapor deposition (CVD) method. The reason for using the CVD method is that a CVD produced insulator will ordinarily have enough quality to seal off wafer vapors from a SOG (Spin on Glass) layer underneath the insulator layer. However, while only an upper CVD insulator layer of a multilayer semiconductor device is to be wet etched, even the lower SOG layer is also frequently etched accidentally by the wet etchant. FIGS. 13–16 illustrate this etching problem in the prior art.

FIGS. 13–16 illustrate cross-sectional views of a multilayer semiconductor device corresponding to different sequential stages of the conventional fabricating method. As shown in FIG. 13, a Spin on Glass (SOG) layer 2 is coated over a Plasma Enhanced CVD (PE-CVD) SiON liner 11, and the coated SOG layer 2 is baked so as to melt and flow. A Plasma Enhanced CVD (PE-CVD) oxide film 3 is formed over the surface of the SOG layer 2. A photoresist 4 having an opening pattern is formed over the surface of the PE-CVD oxide film 3.

In the chemical vapor deposition step to form the PE-CVD oxide film 3, start/stop timing of various gas flow and turning on/off RF (radio frequency) power are depicted in FIG. 17. FIG. 17 shows the timing sequences between four processes, from a start/stop timing of $N_2O$ gas flow and a start/stop timing of RF power to a start/stop timing of $SiH_4$ (monosilane) gas flow at MFC (i.e., at a gas valve) and in-chamber. FIG. 17 shows that these four processes listed along the ordinate axis alter in accordance with time along the abscissa axis. First, $N_2O$ gas flow is turned on, followed by RF power being turned on to generate gaseous plasma, $SiH_4$ (monosilane) gas flow is next turned on at MFC, and lastly, $SiH_4$ gas is introduced into a CVD chamber. When ending this CVD step, each of these processes (i.e., the top three processes) are turned off in reverse order, as shown in FIG. 17. The timing sequence of the $SiH_4$ gas flow in-chamber, depicted on the bottom of FIG. 17, mirrors the $SiH_4$ gas flow at MFC because the $SiH_4$ gas flow in-chamber is the same $SiH_4$ gas flow at MFC, but merely separated by a small time differential $\Delta t$ for the $SiH_4$ gas to travel into the chamber from the gas valve.

FIG. 13 shows the cross-sectional view of the multilayer semiconductor device at a state just after wet etching of the PE-CVD oxide film 3 through an opening of the photoresist 4. When depositing the PE-CVD oxide film 3, string-like defects 61 stretching from defect nucleic 62 are formed in accordance with the thickness of the deposited PE-CVD oxide film 3. If the string-like defects 61 appear on or near an isotropic etched surface of the PE-CVD oxide film 3 (such as string-like defects 63), then the wet etchant may penetrate the SOG film 2 through the string-like defects 63. As a result of this penetration into the SOG film 2, the SOG film 2 is very often accidentally etched, creating many bubble-like defects 70 near the surface of the SOG film 2.

Following the above-mentioned steps, a portion of the surface of the metal interconnect 10 is exposed using anisotropic etching through photoresist mask 4 along a dotted line portion of the semiconductor device depicted in FIG. 14. Typically, Reactive Ion Etching (RIE) is adopted for the anisotropic etching.

FIG. 15 shows a cross sectional view of the semiconductor device in a state just after the contact hole opening anisotropic etching step, exposing a portion of the metal interconnect 10 surface. If the wet etched bubble-like defects 70 in the SOG film 2 are relatively large, voids 71 are left in the SOG film 2. Moreover, the uneven thickness of the SOG film 2 resulting from the bubble-like defects 70 may also lead to excessive etching in some portions of the via hole, damaging corresponding portions 72 of the exposed surface of the metal interconnect 10.

After the above-described via contact hole opening step, FIG. 16 shows a cross sectional view of the semiconductor device in a state just after a wiring layer 5 is deposited to electrically contact with the metal interconnect 10 surface through the via contact hole. An aluminum alloy is usually used for the wiring layer 5 due to its low electrical resistance. But, since the aluminum alloy or aluminum is, at present, exclusively deposited by a sputtering technique, a coverage profile may be degraded, especially inside the via contact hole having defects 71 and 72. When the wiring layer 5 is deposited by the sputtering method, the coverage profile of aluminum alloy layer, especially in the contact hole region, may be degraded due to so-called "shadowing effects". In particular, aluminum alloy species or particles, sputter-deposited at high speeds, are deposited in voids 71 on the inner surface of the via contact hole and in defects 72 on the metal interconnect 10 surface, and migrate about at random as shown in FIG. 16. Further, the degraded deposited wiring layer 5 can experience migration problems caused by thermal stresses in later steps or by electro migration, resulting in open-circuit failures in the aluminum alloy wiring layer 5. Thus, degradation of product reliability may result.

Moreover, in using an organic silanol material, such as the Spin On Glass (SOG) film 2, numerous bubble-like defects 70 and voids 71 may result. Organic silanol material such as the SOG film 2 is used for a lower interlayer insulator mainly because of its ease in formation. For the same reason, Spin On Siloxane (SOS) or Hydrogen Silsesquioxane $(HSiO_{3/2})_n$ are also suitable for the same purpose. In particular, organic silanol material is easily coatable and can easily planarize the surface of the interlayer insulator. However, such coatable insulating materials are basically fragile and are easily etched because of their very high etching rate. If the wet etchant solution penetrates through the string-like defects 63 to arrive at the lower interlayer insulator (e.g., the SOG film 2), then the wet etchant proceeds to etch the lower interlayer insulator at a higher etching rate. Therefore many bubble-like defects 70 and voids 71 are easily formed near the boundary between the upper interlayer insulator (e.g., the PE-CVD oxide film 3) and the lower interlayer insulator (e.g., the SOG film 2).

In such conditions, problems will inevitably occur. Even if no voids are formed in the lower interlayer insulator, portions of the PE-CVD oxide film 3 itself can be accidentally etched off due to such defects, and therefore electrical shorts between the metal interconnect layers and degradation of insulation quality may result in highly integrated devices.

Under such conditions, even if a wet etchant is necessarily used to open the via contact hole into the interlayer insulating film, new techniques are needed to solve both problems, i.e., where the lower insulating film is accidentally etched off, and where the aluminum alloy layer is easily voided at the edge of the via contact hole.

Although the problems related to the use of wet etching in opening a via contact hole was described above, there are still significant problems even when no wet etching is used. Consider the situation where string or bump like defects arise from gas phase nucleation or where other particles get trapped in an interlayer insulating film during vapor deposition of the film. Then, consider the situation where stress accumulates in the interlayer insulator due to a long term thermal history in annealing steps after deposition of the interlayer insulator. The stress can aggravate defects in the interlayer insulator, leading to a propagation or growth of these defects. This can result in cracks in the interlayer dielectric through which interlayer metal shorts can form.

In addition, since several kinds of wet treatments are commonly adopted in later steps, the lower interlayer insulator may accidentally be etched by the wet etchant or even by pure water diffusing through enlarged defects resulting from the stress described above. Even without wet etching in later steps, coating the insulating film usually involves relatively large amounts of water, and high temperatures are used during later annealing steps to vaporize moisture which can penetrate other layers. If other kinds of material involve P (phosphorous), water vapor and phosphorous chemically react to generate phosphoric acid, which will accidentally etch the aluminum alloy film or other metal film. Another concern is the degradation of insulation quality of the interlayer insulator.

SUMMARY OF THE INVENTION

It is an object of the present invention to solve the above-described problems in the prior art.

It is another object of the present invention to prevent degradation of interlayer insulator quality resulting from string or bump like defects in interlayer insulators.

It is yet another object of the present invention to prevent defects to layers below interlayer insulators during a via contact hole opening process resulting from defects in the interlayer insulators.

It is a further object of the present invention to solve the above-described prior art problems without drastic alteration of the present fabrication processes.

Objects of the present invention are achieved by providing a semiconductor device having a substrate with a conductive film; an insulator layer, formed over the substrate, with an internal boundary layer that prevents elongation of string-like defects across the boundary layer; and a wiring layer formed over the insulator layer and contacting the conductive film of the substrate through the insulator layer.

Objects of the present invention are also achieved by providing a semiconductor device having a substrate with a conductive film, an insulator layer formed over the substrate, and a wiring layer formed over the insulator layer contacting the conductive film in the substrate through the insulator layer, wherein the insulator layer has insulator films and boundary layers, each of the boundary layers separating each of the insulator films, the boundary layers having a density greater than a density of said insulator films.

Objects of the present invention are further achieved by providing the following features. The boundary layers are significantly thinner than the insulator films in the insulator layer. For instance, the boundary layers are approximately 10–15 nm, while the insulator films may be on the order of tens of nanometers. However, the boundary layers are significantly more dense than the insulator films so as to prevent the expansion and elongation of string-like defects across the boundary layers. The insulator layer is made of silicon oxide and the boundary layers have a lower concentration of nitrogen than the insulator films. Upper insulator films of the insulator layer have a greater thickness than lower insulator films, wherein the upper insulator films and boundary layers form a step-shaped sloped opening through which the wiring layer contacts the conductive film of the substrate in order to improve deposition of the wiring layer.

Objects of the present invention are also achieved by providing a method of fabricating a semiconductor device in an air-tight chamber, including the steps of mixing gases to form an insulator film; temporarily stopping or reducing a flow of one of the gases for a predetermined amount of time to form a boundary layer over the insulator film; and restarting the flow of the one gas previously stopped.

Objects of the present invention are still further achieved by providing a method of fabricating a semiconductor device in an air-tight chamber, including the steps of mixing a nitrogen containing gas and a silane group gas to form an insulator film; temporarily stopping a flow of the silane group gas for approximately one to fifteen seconds to form a boundary layer over the insulator film; restarting the flow of the silane group gas; and repeating the steps of temporarily stopping and restarting for a predetermined number of times to form a plurality of alternately layered insulator films and boundary layers. A further step may include forming a step-shaped sloped opening in an upper portion of the plurality of alternately layered insulator films and boundary layers by etching the insulator films at an etching rate greater than an etching rate for the boundary layers.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
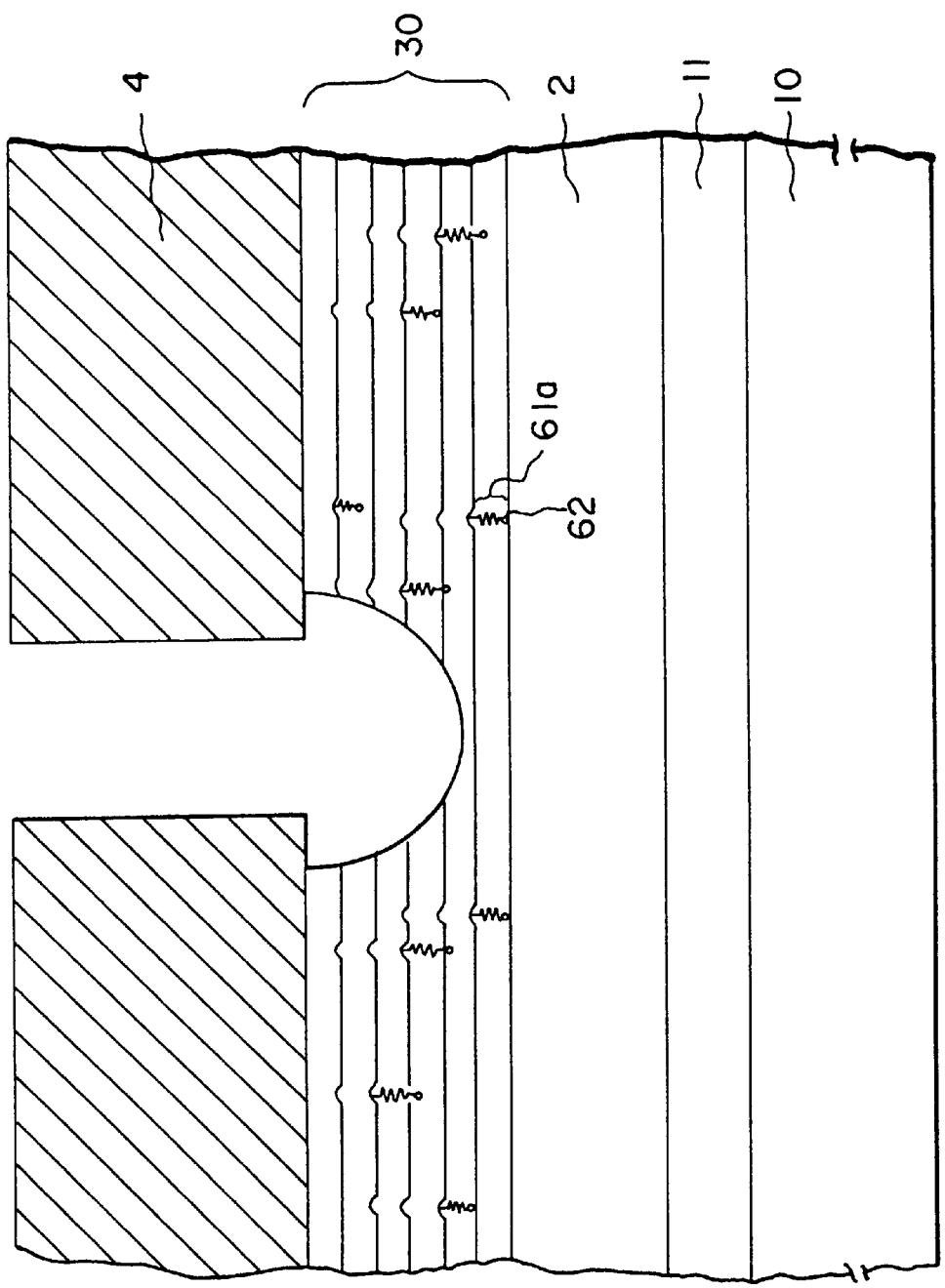
FIGS. 1 to 4 are cross sectional views of a semiconductor device according to an embodiment of this invention.

Reference will now be made in detail to the preferred embodiments of the present invention, examples of which are illustrated in the accompanying drawings FIGS. 1 to 12, wherein like reference numerals refer to like elements throughout.

FIGS. 1–4 are cross sectional views of a semiconductor device, according to a preferred embodiment of the present invention, relevant to a process for the formation and filling of a via contact hole in the semiconductor device. FIGS. 5–9 illustrate details of a fabrication process for an interlayer insulator and the resulting structure of the interlayer insulator in the semiconductor device. The interlayer insulator, according to the present invention, contributes to improvements in the formation of the via contact hole and the resulting metal interconnection. The following description of a preferred embodiment of the present invention will start with a description of FIG. 1, continue with a detailed description of the fabrication and structure of the interlayer insulator of the present invention using FIGS. 5–9, and then resume with a discussion of the remaining process to open the via contact hole using FIGS. 2–4.

The multilayer structure depicted in FIG. 1 includes a conductive film (or metal interconnect) 10, a Plasma Enhanced CVD (PE-CVD) SiON liner 11, a Spin On Glass (SOG) film 2, a Plasma Enhanced CVD (PE-CVD) oxide film 30, and a photoresist 4, formed in this order.

FIG. 1 depicts a state of the semiconductor device just after a wet etchant was used to make a sloping opening in the PE-CVD oxide film 30 through an opening in the photoresist 4. The wet etchant isotropically etches the PE-CVD oxide film 30 to produce a sloped surface on the exposed portion of the PE-CVD oxide film 30.

The PE-CVD oxide film 30, according to the present invention, has physical boundaries within its structure, and is therefore a multilayered structure itself. Although string-like defects 61a, stretching from defect nucleic 62, are still formed inside the PE-CVD oxide 30, the boundary layers inside the PE-CVD oxide film 30 prohibit elongation and/or widening of string-like defects 61a. Thus, the string-like defects 61a are shorter than the string-like defects 61 of the prior art.

Fabrication of the multilayered semiconductor device depicted in FIG. 1 will now be described in detail. At first, the interconnect layer 10 is deposited over a silicon wafer substrate. The PE-CVD SiON liner 11 is then deposited over the conductive film 10 by a chemical vapor deposition (CVD) method. The SOG film 2 is coated over the PE-CVD SiON liner 11 by a rotation of the silicon wafer substrate at the rate of approximately 4000 r.p.m. After the coating of the SOG film 2, the SOG film 2 is baked by the thermal annealing of the semiconductor device under 150, 200, and 350° C., enough to vaporize a solvent portion of the SOG film 2. Next, the semiconductor device is cured under 400° C. for 1 hour.

Organic films may be used for the SOG film 2. Instead of organic films, an inorganic material including, but not limited to, SOS (Spin On Siloxane) or Hydrogen Silsesquioxane $(HSiO_{3/2})_n$ may also be used in place of the SOG film 2.

The SOG film 2 is used as a lower interlayer insulating film mainly because it makes surface planarizing easier. When upper wiring layers are formed over the interlayer insulating films, undesirable surface bumps may result from surface roughness on underlying interlayer insulating films, especially when surface bumps on the underlying layers are magnified in accordance with the numbers of the layers formed over it. The resulting surface over all the underlying interlayer insulating films may therefore be rugged. Correctly focusing on a rugged substrate surface is very difficult when the patterning of the upper wiring layer through a well-known photolithographic technique must compensate for the existence of varying depths thereon. Accordingly, before the deposition of the upper layers, interlayer insulating films are planarized in intermediate steps.

Besides using an interlayer insulater coating such as the SOG film 2 to improve surface planarization, an etch back method from the top surface of the interlayer insulating film toward the bottom thereof through a Chemical Mechanical Polishing (CMP) method may also be used for the same purpose. If CMP is used for planarizing the interlayer insulator surface, the material used for the interlayer insulating film may be freely chosen. For instance, Plasma Enhanced CVD insulating film HDP-SiO (High Density Plasma Silicon Oxide) film may also be suitable for the interlayer insulating film when CMP is used for surface planarization.

After forming the lower interlayer insulator (i.e., the SOG film 2), the upper interlayer insulator (i.e., the PE-CVD oxide film 30) is deposited over the surface of the SOG film 2. The formation and structure of the PE-CVD oxide film 30 will now be described in detail, with reference to FIGS. 5–9.

Figure 5:
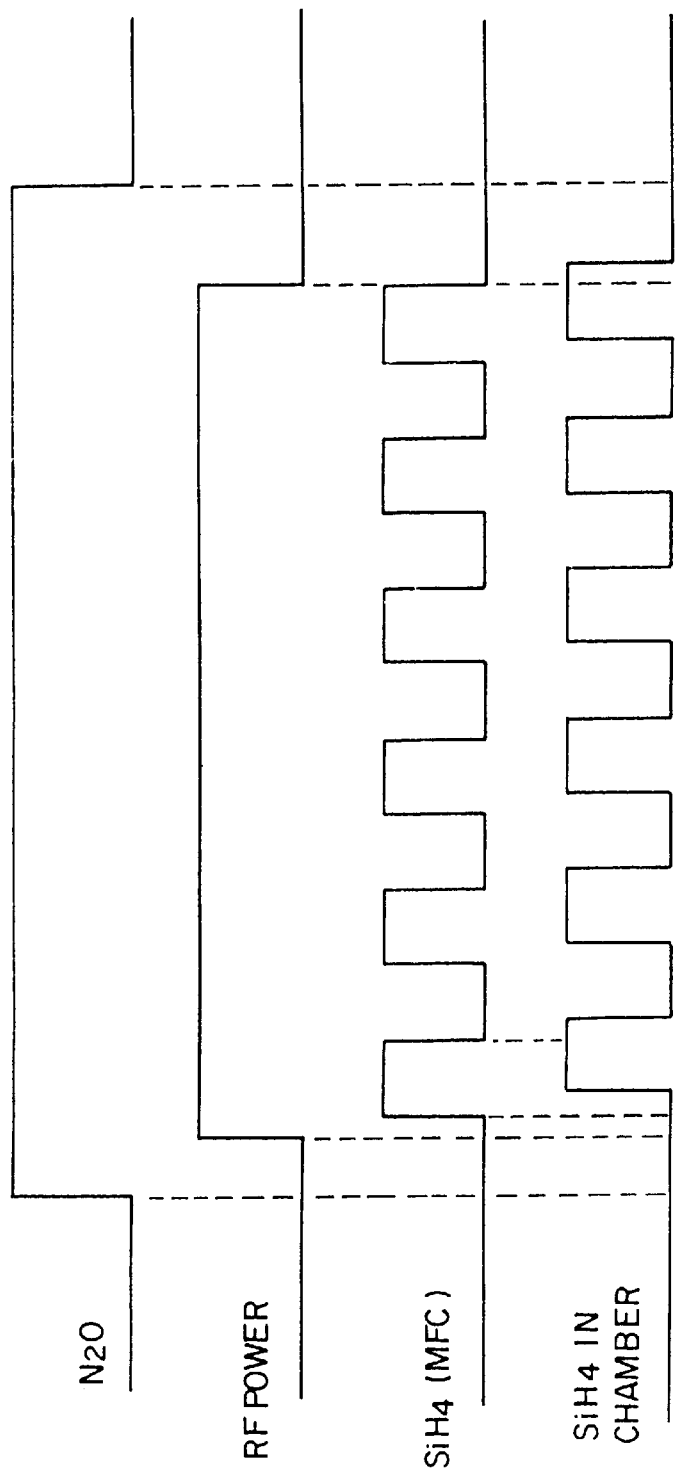
FIG. 5 is a diagram showing timing sequences of processes according to an embodiment of this invention.
Figure 6:
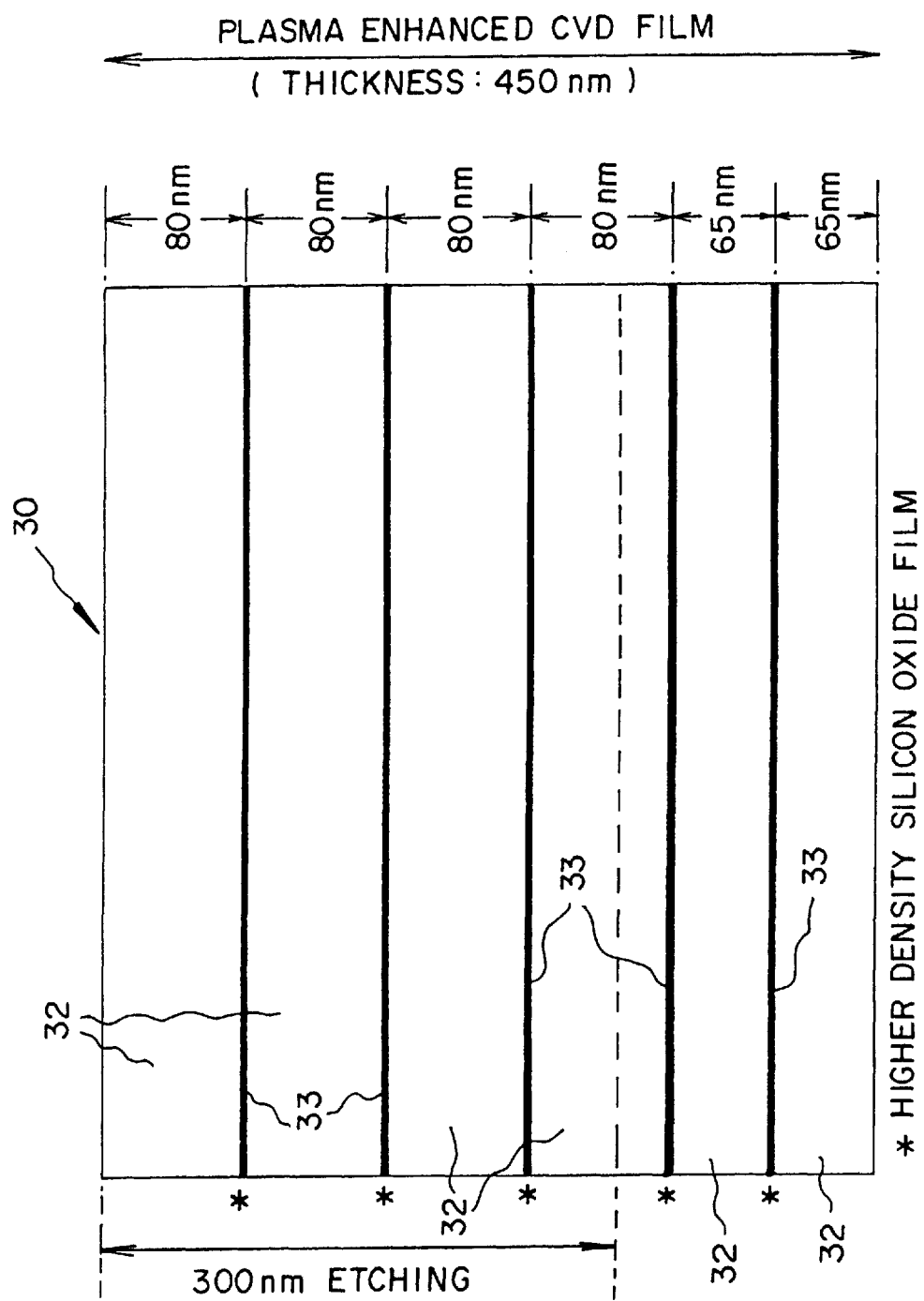
FIG. 6 is a cross sectional view of a six layer plasma-enhanced CVD insulator according to an embodiment of the present invention.

FIG. 5 is a diagram showing timing sequences for several processes according to a preferred embodiment of the present invention. FIG. 5 illustrates the processing sequence for creating a six layered Plasma Enhanced CVD insulating film, as shown in FIG. 6. Four types of processes are listed on the ordinate axis. These processes change in accordance with time along the abscissa axis. The four processes include start/stop of $N_2O$ gas flow, turning on/off RF (Radio Frequency) power, start/stop of $SiH_4$ (monosilane) gas flow at MFC (i.e., at the gas valve), and start/stop of $SiH_4$ (monosilane) gas flow into a CVD chamber. The timing sequence of the $SiH_4$ gas flow in chamber, depicted on the bottom of FIG. 5, mirrors the $SiH_4$ gas flow at MFC because the $SiH_4$ gas flow in chamber is the same $SiH_4$ gas flow at MFC, but merely separated by a small time differential for the $SiH_4$ gas to travel into the chamber from the gas valve.

At the start of fabrication of the PE-CVD oxide film 30, the silicon wafer substrate having the SOG film 2 is placed inside a plasma CVD chamber. For deposition of the PE-CVD oxide film 30, $N_2O$ (1600 sccm) and $SiH_4$ (90 sccm) are used as deposition gases. RF power is 200–260 Watt. First, $N_2O$ gas is introduced into the chamber. Five seconds after beginning of $N_2O$ flowing, RF power turns on and Radio Frequency (RF) is generated inside the chamber. Fifteen seconds after turning on RF power, $SiH_4$ gas is introduced into the chamber. Fifteen seconds after starting $SiH_4$ gas flow, $SiH_4$ gas flow is temporarily stopped. $SiH_4$ gas flow remains stopped for a few seconds. The starting and stopping of $SiH_4$ gas flow is periodically repeated, as shown in FIG. 5. The final stopping of $SiH_4$ gas flow is executed at the same time as the RF power is turned off. Five seconds later, $N_2O$ gas flow is also cut off. As mentioned above, the start/stop timing of $SiH_4$ gas flow into the CVD chamber is delayed by a short time for the gas to travel from the gas valve into the CVD chamber.

FIG. 6 is a cross sectional view of a Plasma Enhanced CVD oxide insulator according to a preferred embodiment of the present invention. The PE-CVD oxide insulator depicted in FIG. 6 is an enlarged cross sectional view of the PE-CVD oxide film 30, shown in FIG. 1, having six layers resulting from the processing sequence depicted in FIG. 5. The material forming the layered insulator films 32 includes silicon oxide formed during the periods when both $SiH_4$ gas and $N_2O$ gas are supplied into the chamber in accordance with following chemical reaction:

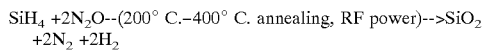

$$SiH_4 + 2N_2O\text{--}(200°\text{ C.–}400°\text{ C. annealing, RF power})\text{--}>SiO_2 + 2N_2 + 2H_2$$

However, higher density $SiO_2$ (silicon oxide) boundary layers 33 are also formed in the silicon oxide deposition film. These higher density boundary layers 33 result from the desorption of reaction by products (e.g., nitrogen in particular) and the migration of adsorbed reactants onto stable sites in the silicon oxide deposition film during the periods when only $N_2O$ gas is flowing into the chamber ($SiH_4$ gas flow being temporarily stopped, as shown in FIG. 5).

The six layer PE-CVD oxide film 30, includes two layers of 65 nm in thickness and four layers of 80 nm in thickness, in the order from the lower layers to the upper layers. The Plasma Enhanced oxide films 32 sandwiched between the more dense silicon oxide boundary layers 33 are deposited during the time when both $SiH_4$ gas and $N_2O$ gas are flowing into the chamber. As mentioned above, each of dark colored layers are the higher density $SiO_2$ boundary layers 33, which are formed during the time when only $N_2O$ gas is flowing into the chamber (while $SiH_4$ gas flow is temporarily stopped). The thickness of these boundary layers 33 are approximately 10 to 15 nm. The PE-CVD oxide film 30 has a thickness of 450 nm as a whole, but 300 nm in depth from the surface of the PE-CVD film 30 is etched away during an isotropic etching step.

The photoresist 4 is coated on the surface of the PE-CVD oxide film 30. An opening pattern in the photoresist 4 (shown in the middle portion of FIG. 1) is opened through the conventional photolithography method. Afterwards, the PE-CVD oxide film 30 is exposed to a wet etchant, which soaks through the opening pattern of the photoresist 4. Several kinds of wet etchant may be used for this purpose. Especially, solution mixed as $H_2O$ : HF : $NH_4F$=60–130 : 1 : 7–9 or 4 : 1 : 0 can preferably be used for acquiring a good etching result. Any wet oxide etchant (including, but not limited to, Buffered Oxide Etcher, Buffered HydroFluoride solution, or HydroFluoride solution) can also be preferable used for the same purpose.

Figure 7A:
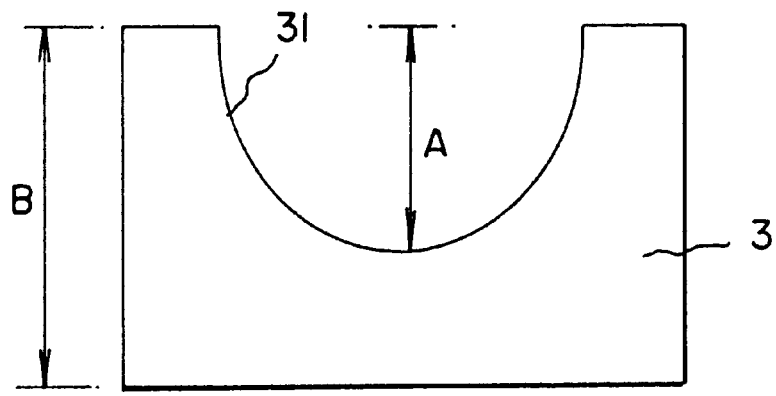
FIG. 7 depicts comparison cross sectional views of contact holes between the prior art (FIG. 7A) and an embodiment of the present invention (FIG. 7B)
Figure 7B:
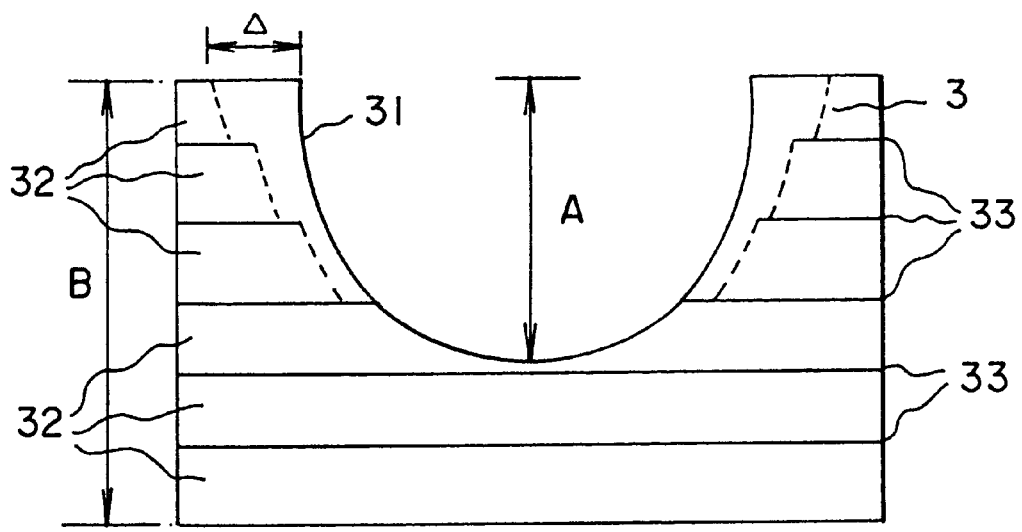

The application of the wet etchant produces the gently sloped profile in the PE-CVD oxide film 30, as shown in FIG. 1 (and FIG. 7B). FIG. 7 depicts comparison cross sectional views between the PE-CVD oxide film 3 of the prior art (depicted in FIG. 7A) versus the PE-CVD oxide film 30 according to the present invention (depicted in FIG. 7B) in a state just after the wet etching step for preparing the sloping opening of the contact hole. Reference letter "A" designates the depth of the half rounded isotropically etched portion of the plasma-enhanced CVD oxide film, and "B" designates the thickness of the plasma enhanced CVD oxide film to be isotropically etched.

With regard to the PE-CVD oxide film 3 of the prior art, since a contact hole inner surface 31 stands vertically or very steep near an edge of the contact hole, it is highly possible that aluminum particles are bounded at the vertical or very steep sided surface of the contact hole and are deposited inside the contact hole at random during a sputtering method.

On the other hand, the PE-CVD oxide film 30 of the present invention is a multilayered structure having silicon oxide insulator films 32 sandwiched between more dense silicon oxide boundary layers 33. The two types of silicon oxide layers of the PE-CVD oxide film 30 having different densities are subject to different etching rates. The etching rate of the silicon oxide insulator films 32 between the boundary layers 33 is much higher than the etching rate of the boundary layers 33 using the aforementioned etchant solutions for the wet etchant. Therefore, the wet etching makes a more gentle slope in the PE-CVD oxide film 30 of the present invention than in the prior art, while maintaining the same depth A of the contact hole and the same thickness B of the Plasma Enhanced CVD insulating film.

Moreover, as previously discussed with regard to FIG. 6, the upper four layers in the PE-CVD oxide film 30 are made to be 80 nm thick (thicker than the lower two layers of 65 nm thickness) to contribute to the more gentle slope created during the isotropic etching. The more gentle slope of the PE-CVD oxide film 30 can prohibit the aluminum particles of the wiring layer from accidental migration or increased contact resistance.

Figure 8A:
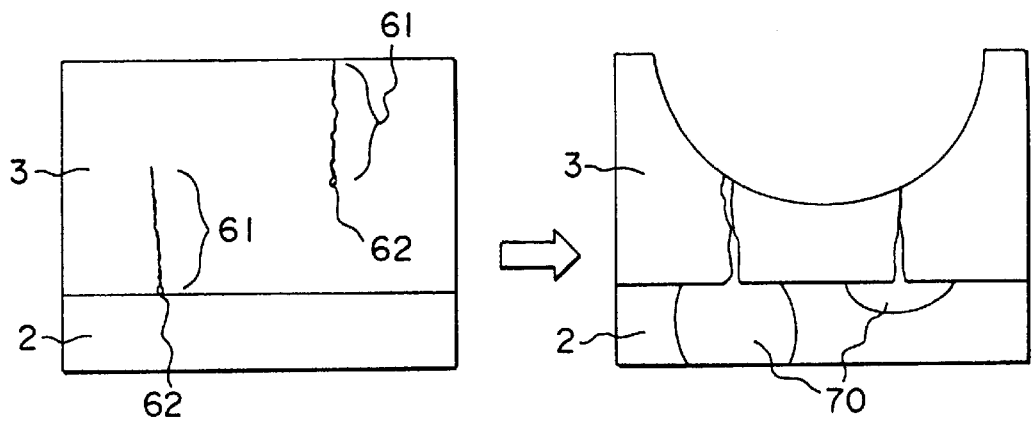
FIG. 8 depicts comparison cross sectional views of wet-etched contact holes with defects between the prior art (FIG. 8A) and an embodiment of the present invention (FIG. 8B)
Figure 8B:
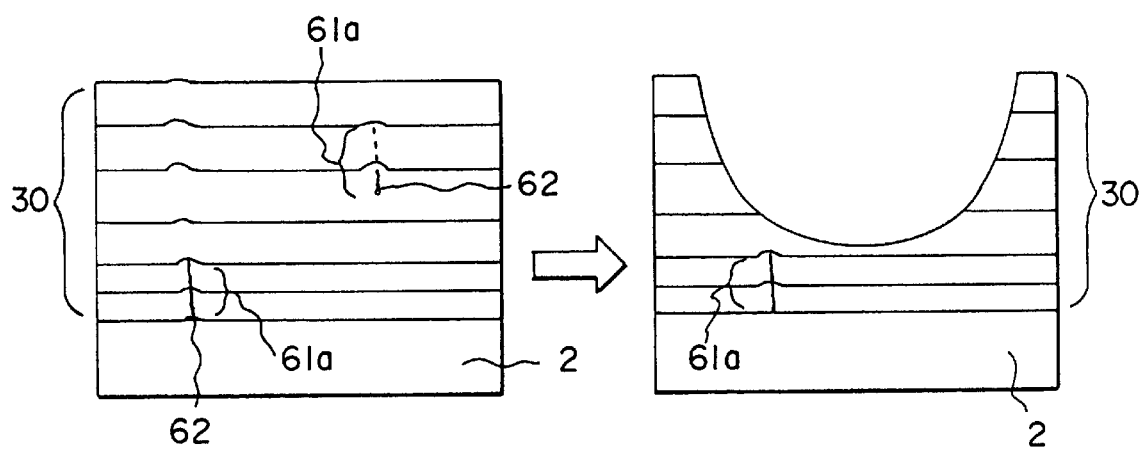

In addition, the multilayered PE-CVD oxide film 30, according to the present invention, reduces the number of long string-like defects originating from defect nucleic 62 near the interface between the PE-CVD oxide film 30 and the underlying SOG film 2. FIG. 8 depicts comparison cross sectional views of the semiconductor device between the prior art (depicted in FIG. 8A) and the present invention (FIG. 8B) at states before and after the wet etching step. Although string-like defects 61*a*, stretching from defect nucleic 62, are still formed inside the PE-CVD oxide 30, the boundary layers inside the PE-CVD oxide film 30 prohibit elongation and/or widening of the string-like defects 61*a*. Thus, the string-like defects 61*a* are shorter than the string-like defects 61 of the prior art. This becomes significant when the PE-CVD oxide film 30 is wet etched to form the sloping opening for the contact hole. The longer string-like defects 61 of the prior art allow etchant to seep through to the underlying SOG film 2, creating the bubble-like defects 70, which lead to the problems in the prior art described above. In contrast, the shortened string-like defects 61a in the PE-CVD oxide film 30 of the present invention do not reach the wet etched surface of the PE-CVD oxide film 30. Thus, according to the present invention, etchant is prevented from seeping into the underlying SOG film 2 and the prevelant bubble-like defects 70 of the prior art are avoided.

Figure 9:
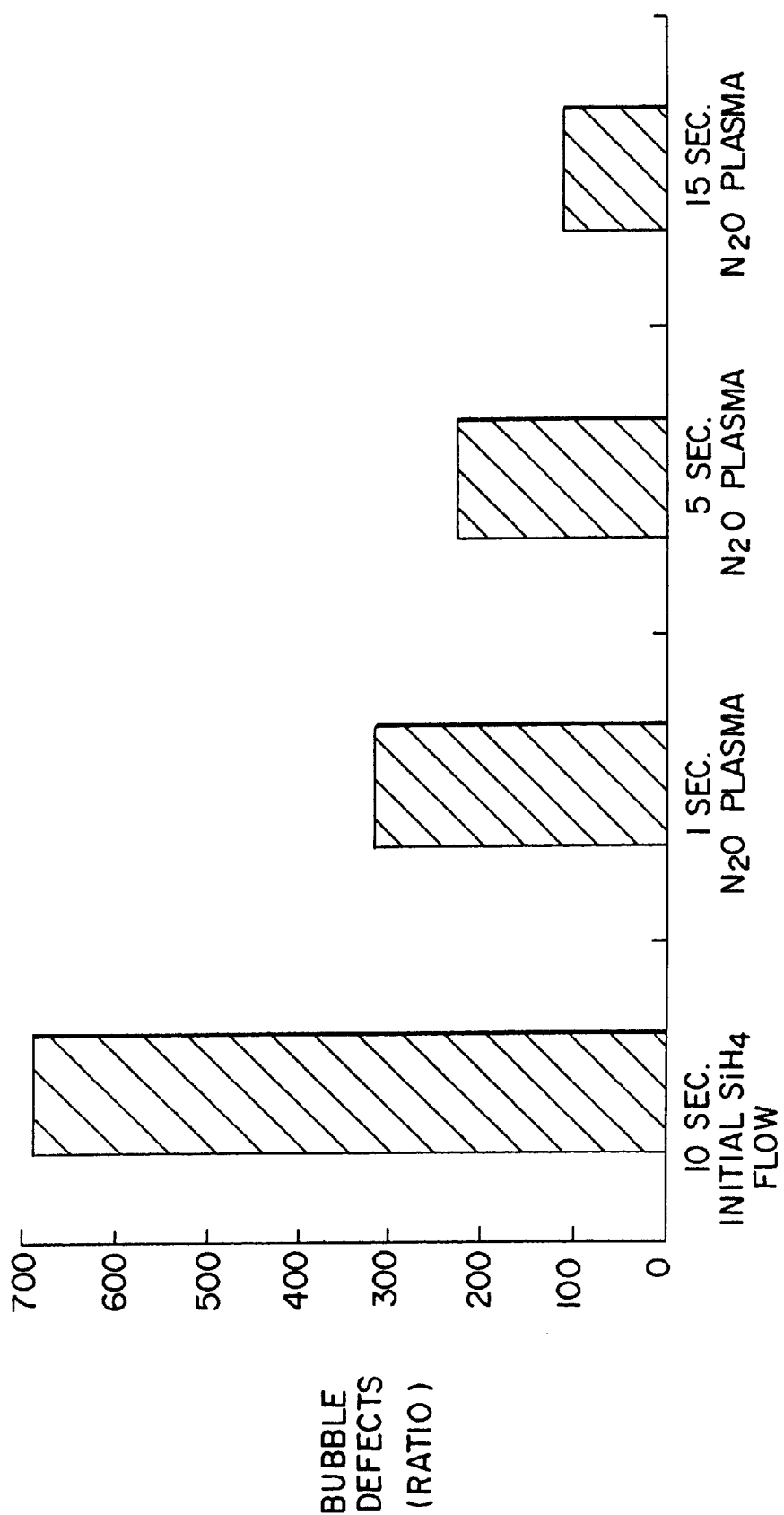
FIG. 9 is a diagram showing changes in the total amount of defects in an interlayer insulator.

Furthermore, while the more dense boundary layers 33 in the PE-CVD oxide film 30 keep the string-like defects 61a short, FIG. 9 also illustrates a correspondance between a reduction in the total number of bubble-like defects 70 and the length of exposure to solely $N_2O$ gas flow in the CVD chamber during creation of the boundary layers 33. FIG. 9 is a diagram showing the variation in the total amount of bubble-like defects 70 caused by the string-like defects 61a or the defect nucleic 62 originating at the interface between the SOG film 2 and the PE-CVD oxide film 30. The total number of bubble-like defects is shown on the ordinate axis and the timing delay for a process sequence depicted in FIG. 5 is shown on the abscissa axis of FIG. 9.

As illustrated in FIG. 9, the longer the amount of time for only $N_2O$ gas flow in the CVD chamber, the less the amount of resulting bubble-like defects 70. When $SiH_4$ gas flow starts ten seconds before $N_2O$ gas flows into the CVD chamber, the highest total number of bubble-like defects 70 resulted. If $N_2O$ gas is introduced into the chamber before the start of $SiH_4$ gas flow, and if there is a period in which gaseous plasma is generated solely by $N_2O$ gas, then bubble-like defects 70 are significantly reduced. While a more dense silicon oxide is formed during the sole $N_2O$ gas flow, impurities including moisture are desorbed during the sole $N_2O$ plasma flow period, reducing the number of the defect nucleic 62 and the corresponding string-like defects 61a. If the period of sole $N_2O$ gas flow is longer, then more desorption occurs until a minimum is reached where bubble-like defects are eliminated or drastically reduced.

Figure 2:
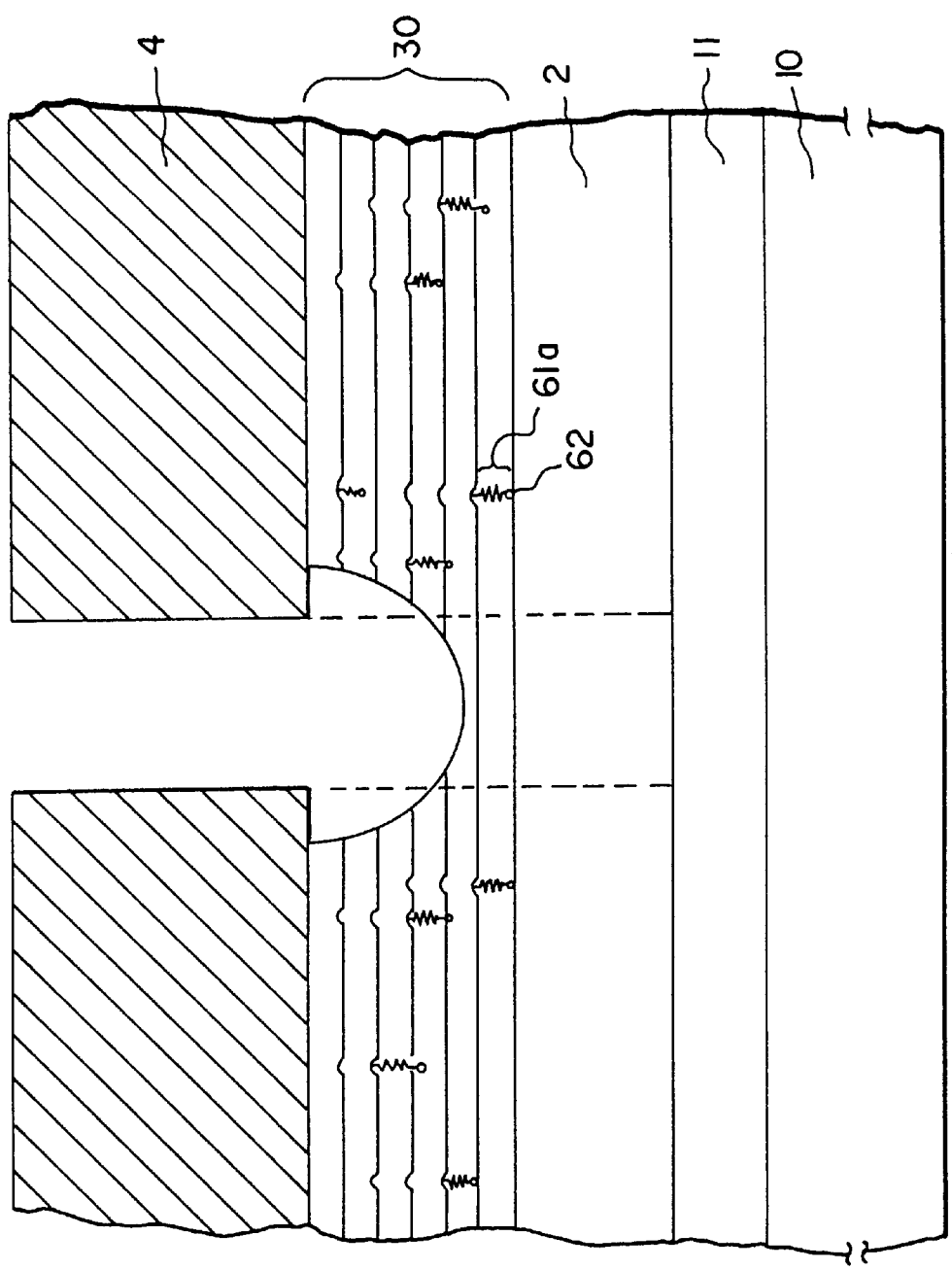
Figure 3:
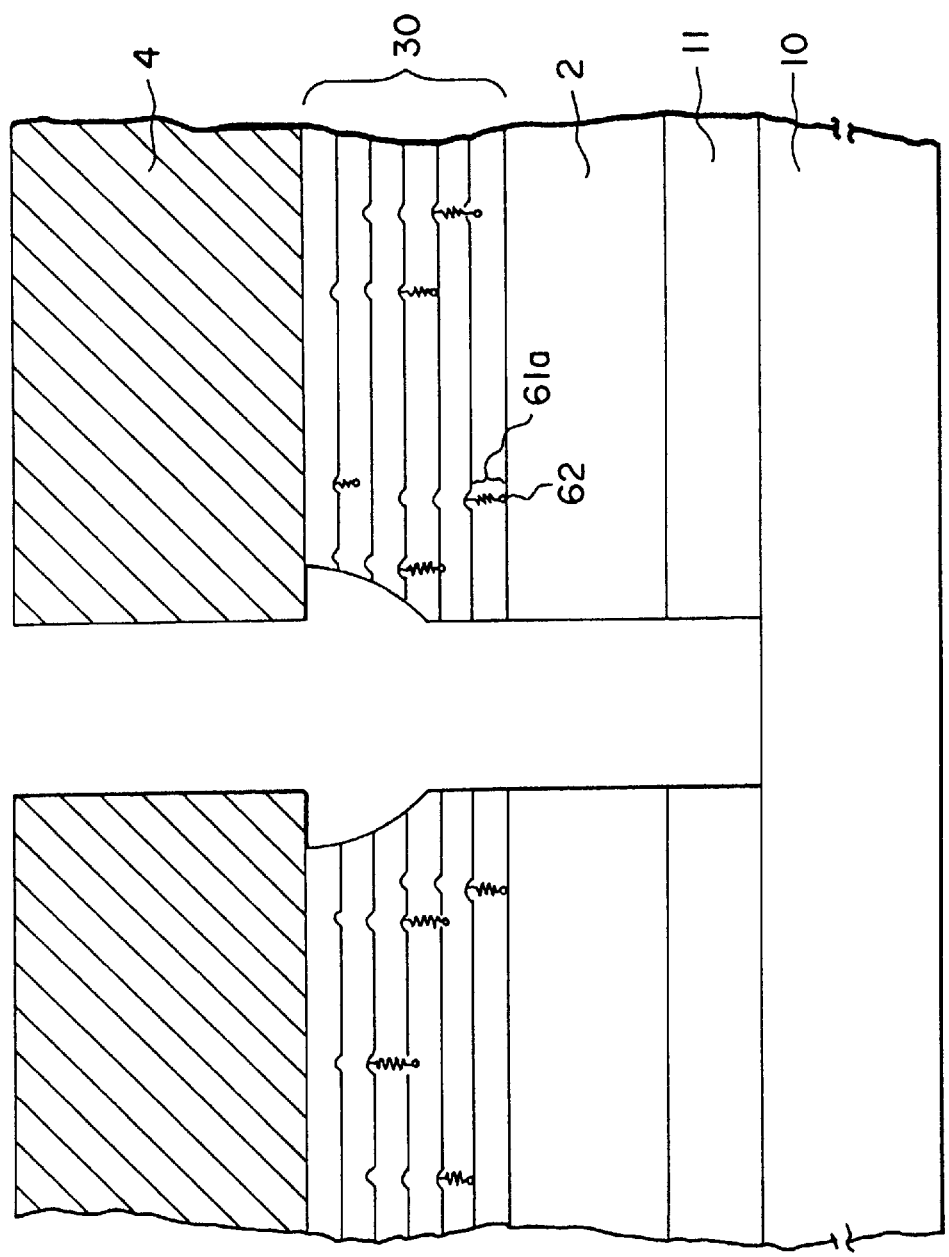

After finishing the isotropic etching of the PE-CVD oxide film 30, Reactive Ion Etching (RIE), using photoresist 4 as a mask, is used to cut into the PE-CVD oxide film 30 and the SOG film 2 in the portion designated by the dotted line in FIG. 2. Etchant gas used for RIE includes, but are not limited to, $CHF_3$ gas flow at 70 sccm, $CF_4$ gas flow at 60 sccm, Argon (At) gas flow at 417 sccm, Helium (He) gas flow at 1042 sccm, and $N_2$ gas flow at 30 sccm. RF power during RIE is at 1400 Watt. Pressure during RIE is approximately at 1000 mTorr. FIG. 3 depicts the state of the semiconductor device just after the RIE process.

Figure 4:
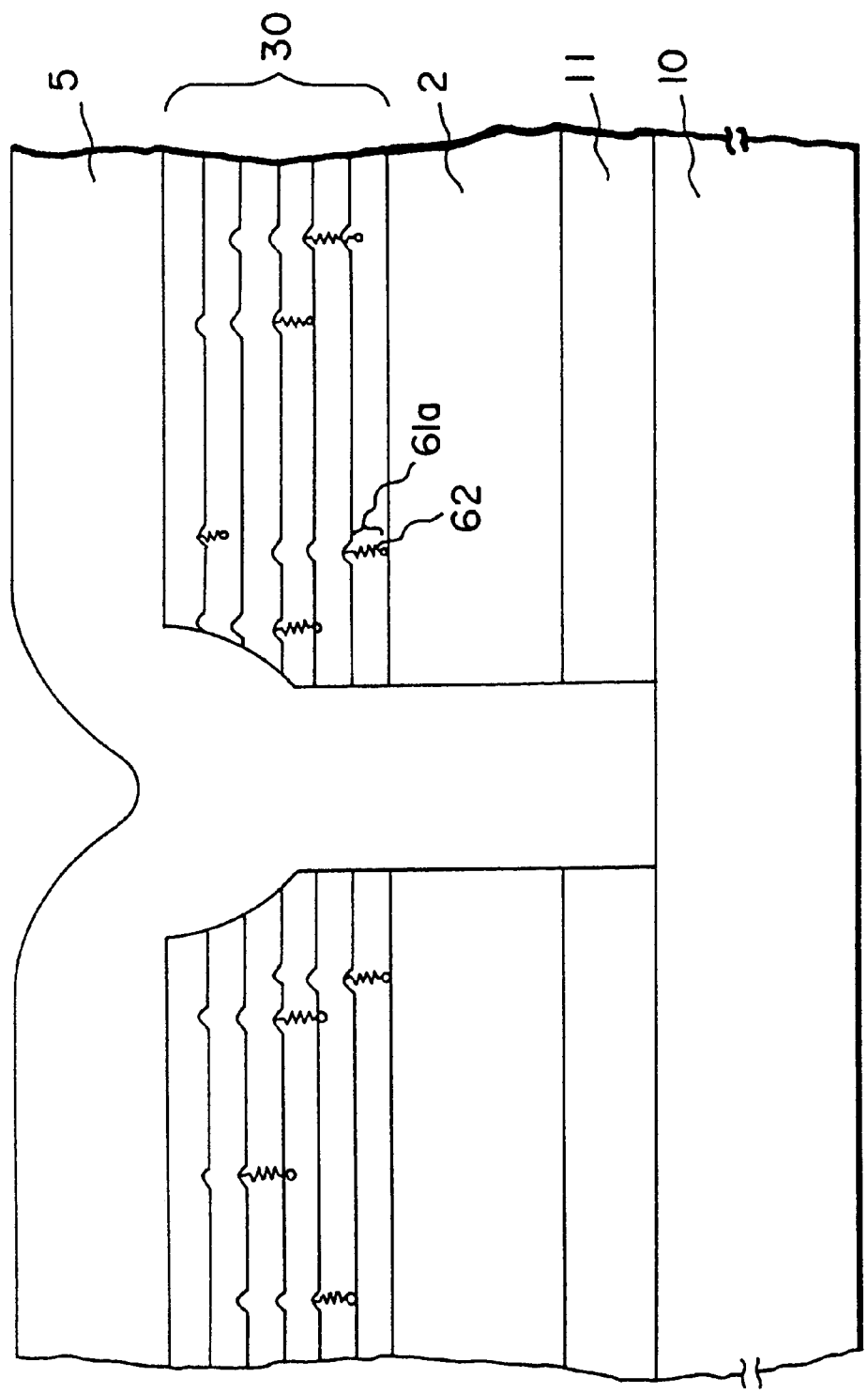

FIG. 4 depicts a cross sectional view of the semiconductor device after an aluminum-containing alloy wiring layer 5 is deposited over the upper insulating layer and inside the contact hole. However, before depositing the wiring layer 5, the wiring layer 5 may be need to be formed inside a sputtering chamber different from the etching chamber. In such a situation, the semiconductor device may need to be carried by hand to the separate sputtering chamber through ambient air. Thus, a natural oxide filmn of approximately several nanometers may be formed on the exposed surface of conductive film 10, i.e. the bottom of the contact hole. Accordingly, such a natural oxide film must be removed before beginning the formation of the wiring layer 5. To remove the natural oxide film, the semiconductor device itself is soaked in diluted wet etchant of Hydro Fluoride 1% solution. Alternatively, Argon sputter etching to the surface of the semiconductor device is also useful to remove the natural oxide film. However, if the semiconductor device is very quickly carried through ambient air, or if the semiconductor device is handled by a robot without exposure to ambient air, then this removing step for the natural oxide film may be omitted.

After removal of the natural oxide film, the aluminum-containing alloy wiring layer 5 is deposited over the whole surface of the upper interlayer insulator (i.e., the PE-CVD oxide film 30) and inside the contact holes by sputtering using aluminum alloy target. Thickness is several hundred nanometers. Even if the contact hole is very small, shadowing effects of sputtering is moderated or dissolved because of the isotropically etched, gently sloped, contact hole inner surface. Therefore, the wiring layer 5 is smoothly deposited inside the contact hole.

Aluminum alloys should be selected in accordance with design and implementation requirements or with the degree of need to prohibit problems, including migrations so-called alloy spikes (if the surface of interest is between a silicon and an aluminum containing conductive film), and the electrical resistance of a wiring layer. Typical examples of wiring materials include, but are not limited to, aluminum-1% silicon, aluminum-0.5% silicon-0.5% copper, aluminums-0.5% silicon-0;5% titanium, aluminum-0.5% copper, and other concentrations of copper, aluminum-titanium, aluminum-copper-titanium, and so on. If a refractory metal or a refractory metal nitride, i.e., titanium or titanium nitride, is deposited to cover the inner surface of the contact hole before sputtering aluminum alloy material, alloy spikes at the boundary between the wiring layer and silicon wafer can be dissolved.

After deposition of the wiring layer 5, a photoresist pattern is formed over the wiring layer 5 through the conventional photolithography method, and the wiring layer 5 is patterned using the photoresist pattern as a mask.

According to different design requirements, additional wiring layers may also be formed above the wiring layer 5 using further interlayer insulating films and further etching of the additional insulator films and wiring layers. Moreover, while the present preferred embodiment has been described with the interlayer conductive layer, the invention is not so limited. For instance, a silicon wafer substrate, a thin poly-silicon film, an amorphous silicon film, or any other material may be used as the underlying substrate. The semiconductor device may also include varying interlayer components. For instance, a multilayer semiconductor device may include a silicon wafer, an interlayer insulating film, a middle wiring layer, an interlayer insulating film according to the present invention, and a wiring layer, in this order.

In addition, as explained above, materials or processes may be freely replaced even if such materials or processes are not mentioned above. For instance, although wet etching has been exemplified as the isotropic etching technique for opening the contact holes, wet etching may be replaced by dry etching.

While the benefits achieved by the boundary layers 33 have been described in relation to problems in the prior art with respect to the isotropic etching to open contact holes, similar benefits will similarily accrue even without the use of isotropic etching to open contact holes. For instance, the benefits in reducing the enlargement of the string-like defects 61a still remain. According to the present invention, even if some defects are generated inside the interlayer insulating film, enlargement or elongation of the string-like defects 61a can be prevented by the boundary layers 33. And, other benefits in preventing the degradation of the insulation quality of the interlayer insulating film still remain. As a result, higher reliability of semiconductor devices having interlayer insulating films according to the present invention can be achieved.

Figure 10:
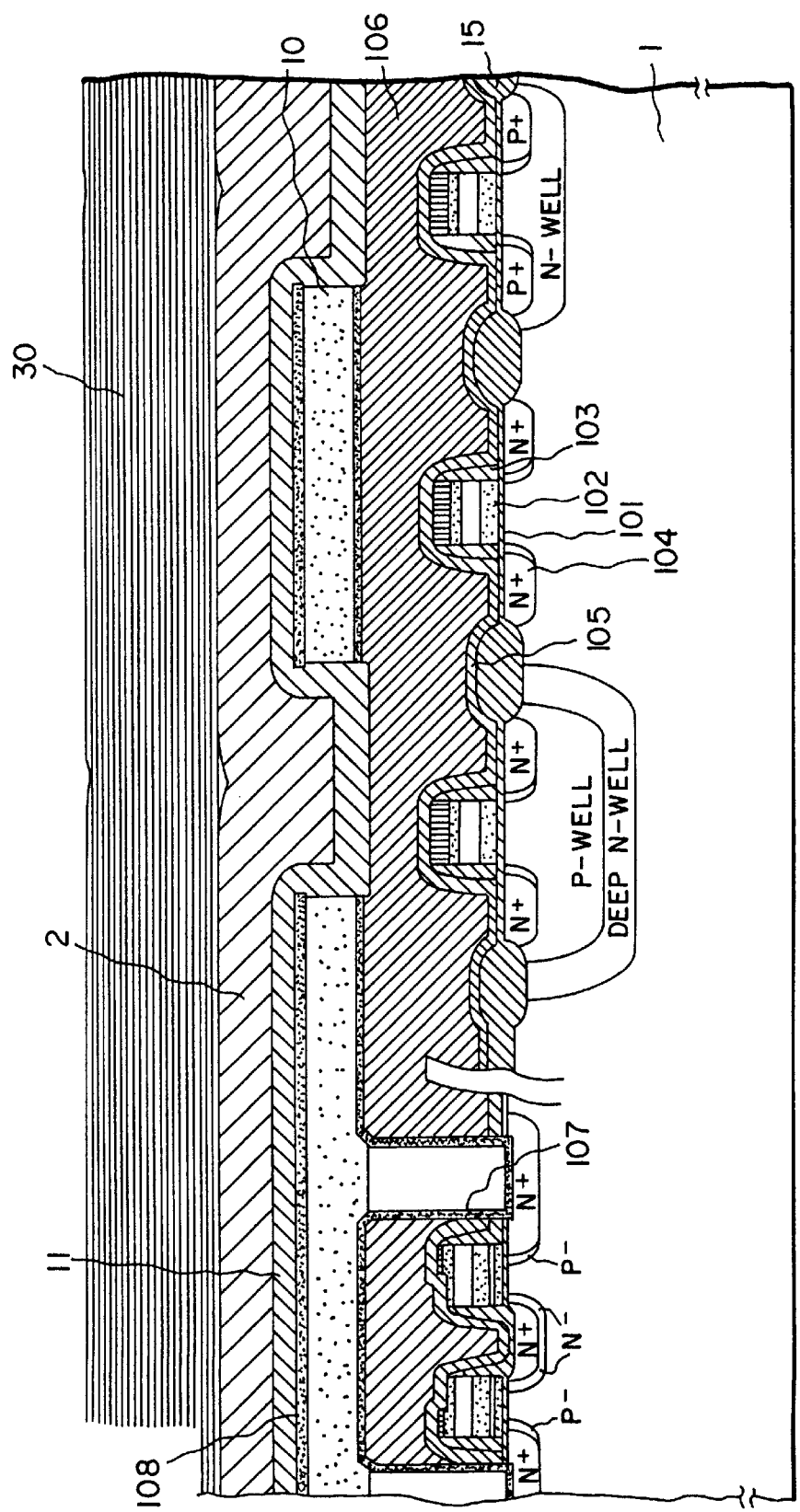
FIGS. 10 to 11 are cross sectional views of a semiconductor device according to an embodiment of the present invention.
Figure 11:
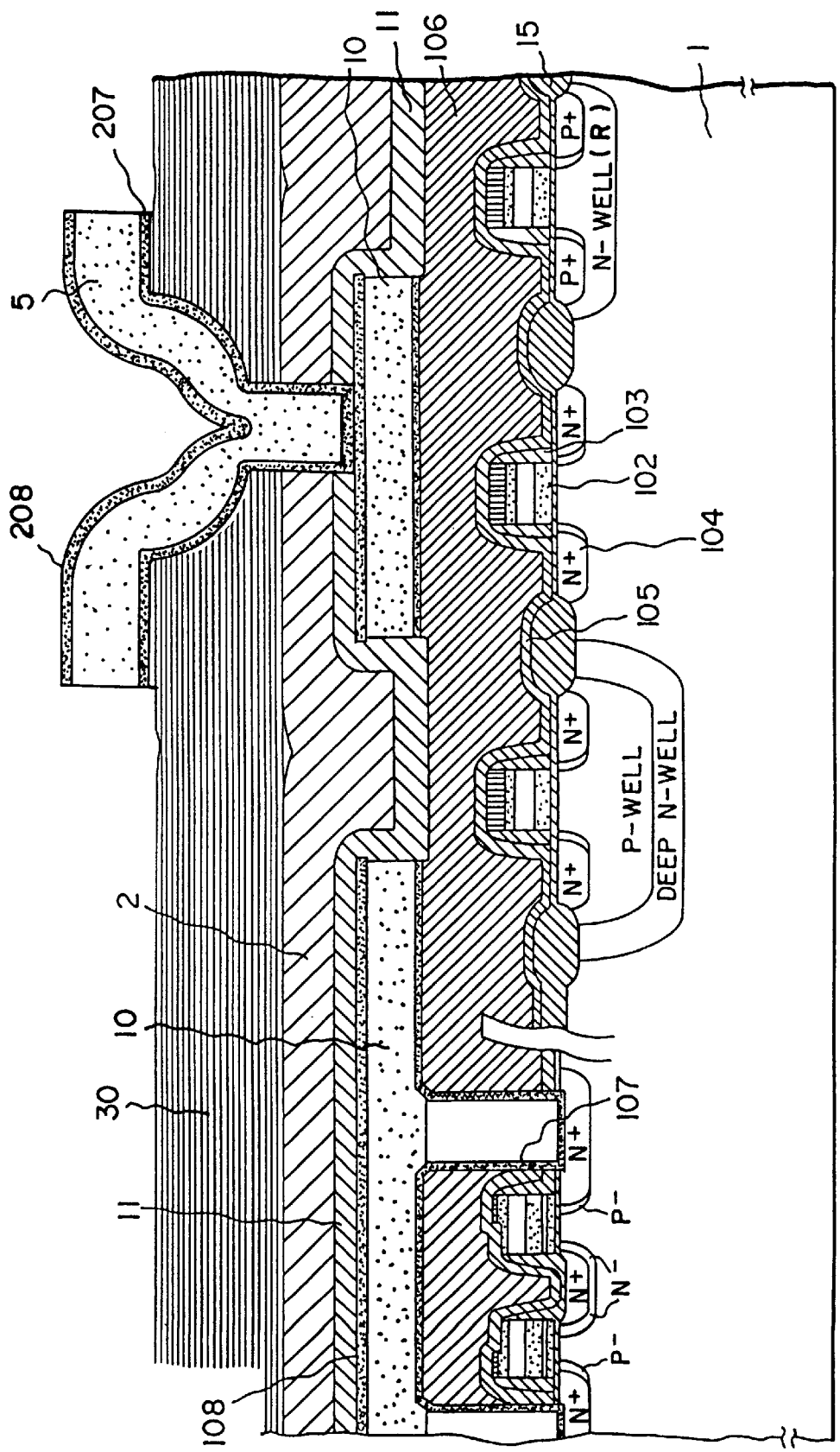

FIGS. 10 and 11 depict cross sectional views of a semiconductor device according to another preferred embodiment of the present invention. FIG. 10 depicts a state of the semiconductor device just prior to opening of a via contact hole in the top layers of the semiconductor device. FIG. 11 depicts a state of the semiconductor device after the via contact hole has been opened and filled with the wiring layer 5 to contact the conductive film (or metal interconnect) 10 within the semiconductor device.

In FIG. 10, device isolation regions are formed on a silicon wafer 1 with a device isolation film 15 using a well-known LOCOS method, and MOSFETs are formed in the device regions sectioned by the device isolation film 15. Gate electrodes 102 are patterned on a gate insulating film 101 inside each device region. A sidewall insulating film 103 covering a sidewall of the gate electrode 102 is formed through a method of dry etching back process. Afterwards, impurities are implanted into the silicon wafer 1 by a self-aligning mask of the sidewall insulating film 103 and the gate electrode 102. Ion implantation will make source/drain regions 104.

A Plasma Enhanced insulating film 105 (e.g., a plasma oxide film) is deposited over a surface of the substrate, covering the sidewall insulating film 103, the gate electrodes 102, the source/drain regions 104, and the device isolation film 15. A thick interlayer insulating film 106 is formed over the Plasma Enhanced insulating film 105. A Boro-phospho Silicate Glass (BPSG) film, a Phospho Silicate Glass (PSG) film, or a High Density Plasma Oxide film are preferrably used for the interlayer insulating film 106. A top surface of the interlayer insulating film 106 is preferably planarized by a method of thermal reflow process or Chemical Mechanical Polishing (CMP) so as not to be rugged, even if there are some bumps on lower layers. If the BPSG film or the PSG film is used for the interlayer insulating film 106, then the aforementioned planarizing process is executed not only by the reflow process by thermal annealing, but also, by the CMP.

Contact holes are opened by well-known anisotropic etching techniques to expose the surface of the source/drain regions 104 inside the silicon wafer 1 from the top surface of the interlayer insulating film 106 after the planarizing thereof. Furthermore, a thin barrier metal layer 107 is deposited inside the contact hole and on the surface of the interlayer insulating film 106. The conductive film 10, made of aluminum-containing alloys, is formed on the barrier metal layer 107 by a sputtering method. Once the interlayer insulating film 106, barrier metal layer 107, and conductive film 10 are wholly etched back through the CMP technique, the conductive film 10 is newly deposited thereon. Furthermore, an anti-reflective film 108 is deposited on top of the conductive layer 10. The stacked layer including the barrier metal layer 107, the conductive layer 10, and the anti-reflective film 108 is patterned by a single anisotropic etching step to form an interlayer wiring pattern. The PE-CVD SiON liner 11 is deposited over the interlayer wiring pattern and on the interlayer insulating film 106 by the CVD method. The Spin On Glass (SOG) film 2 is then formed by coating and baking so as to solidify. The PE-CVD oxide film 30, according to the present invention, is deposited as a multilayered structure over the planarized surface of the SOG film 2 in a manner similar to that described above in the first preferred embodiment of the present invention.

A contact hole is opened so as to expose the anti-reflective film 108 covering the interlayer wiring pattern. Opening of the contact hole is performed by the isotropic-anisotropic etching method from the top surface of the PE-CVD oxide film 30 to the anti-reflective film 108. A thin barrier metal layer 207 is deposited on the surface of the PE-CVD oxide film 30 and into the inner surface of the contact hole. The aluminum-containing alloy wiring layer 5 is formed by sputtering. An anti-reflective film 208 is deposited over the wiring layer 5. The three layered structure, i.e., the barrier metal layer 207, the wiring layer 5, and the anti-reflective film 208, is patterned once through a single anisotropic etching step. The patterned three layered structure is the upper wiring pattern.

Figure 12:
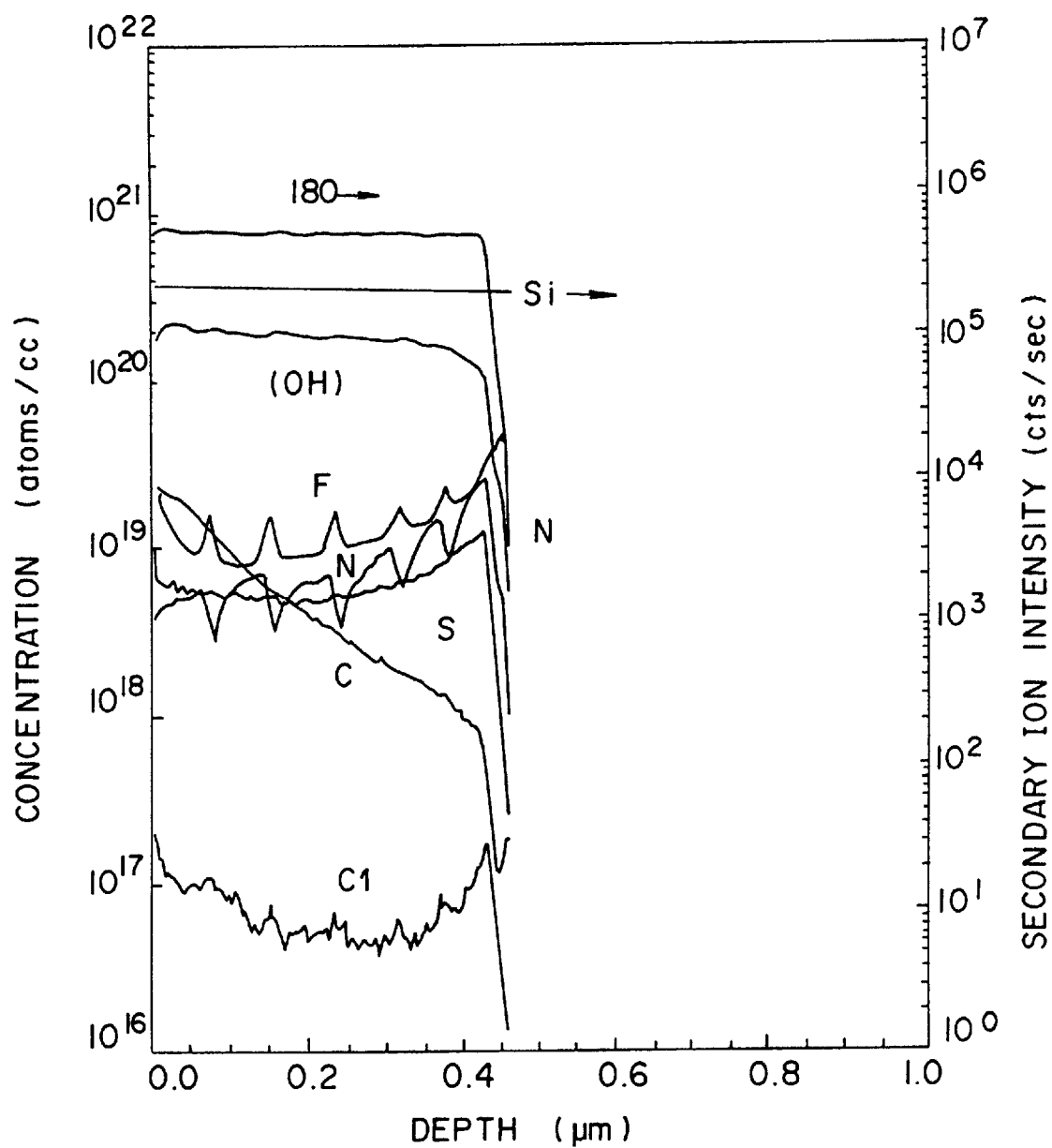
FIG. 12 is a graphical chart showing alteration data of the concentration in accordance with alteration of the depth.
Figure 13:
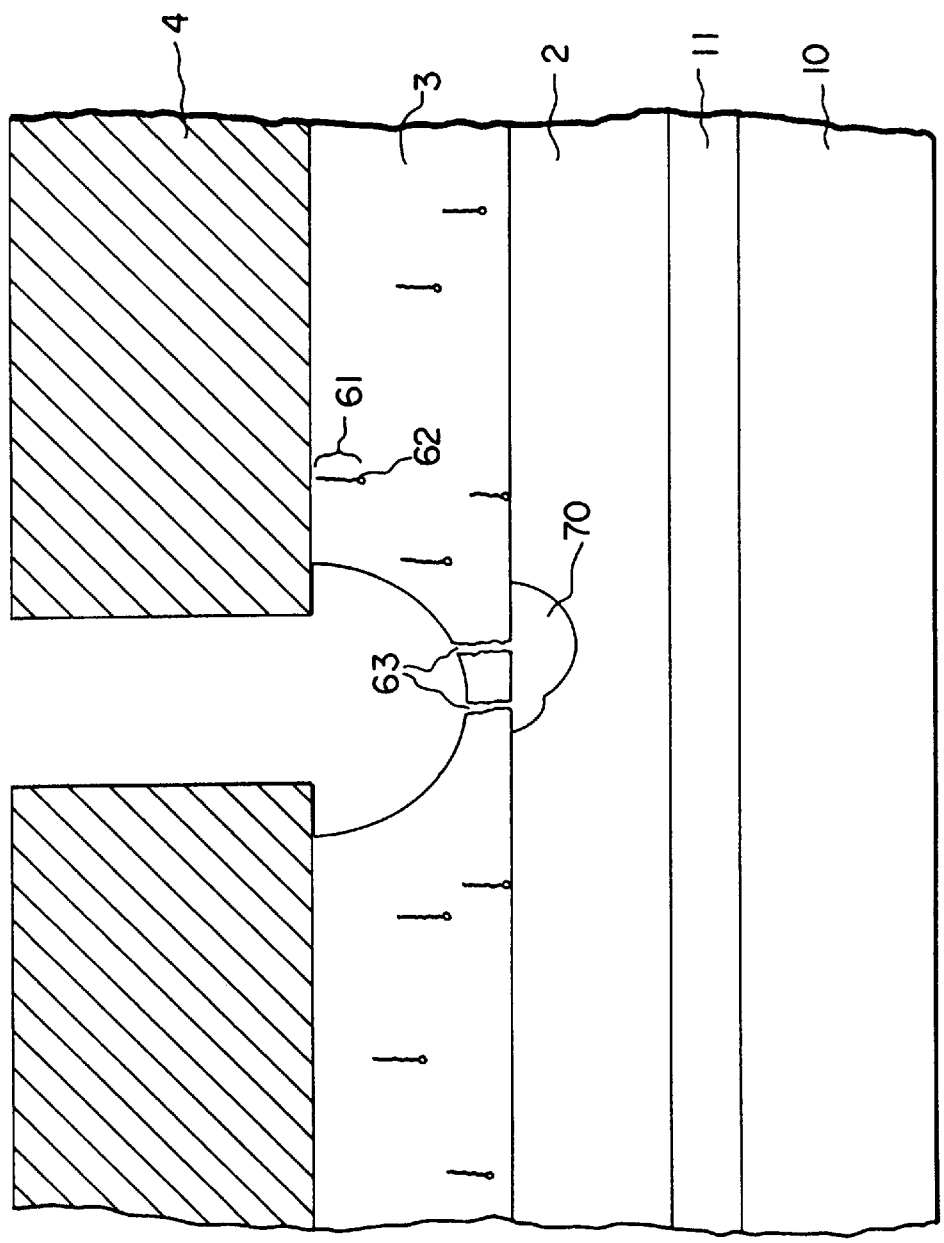
FIGS. 13–16 are cross sectional views of a conventional semiconductor device.
Figure 14:
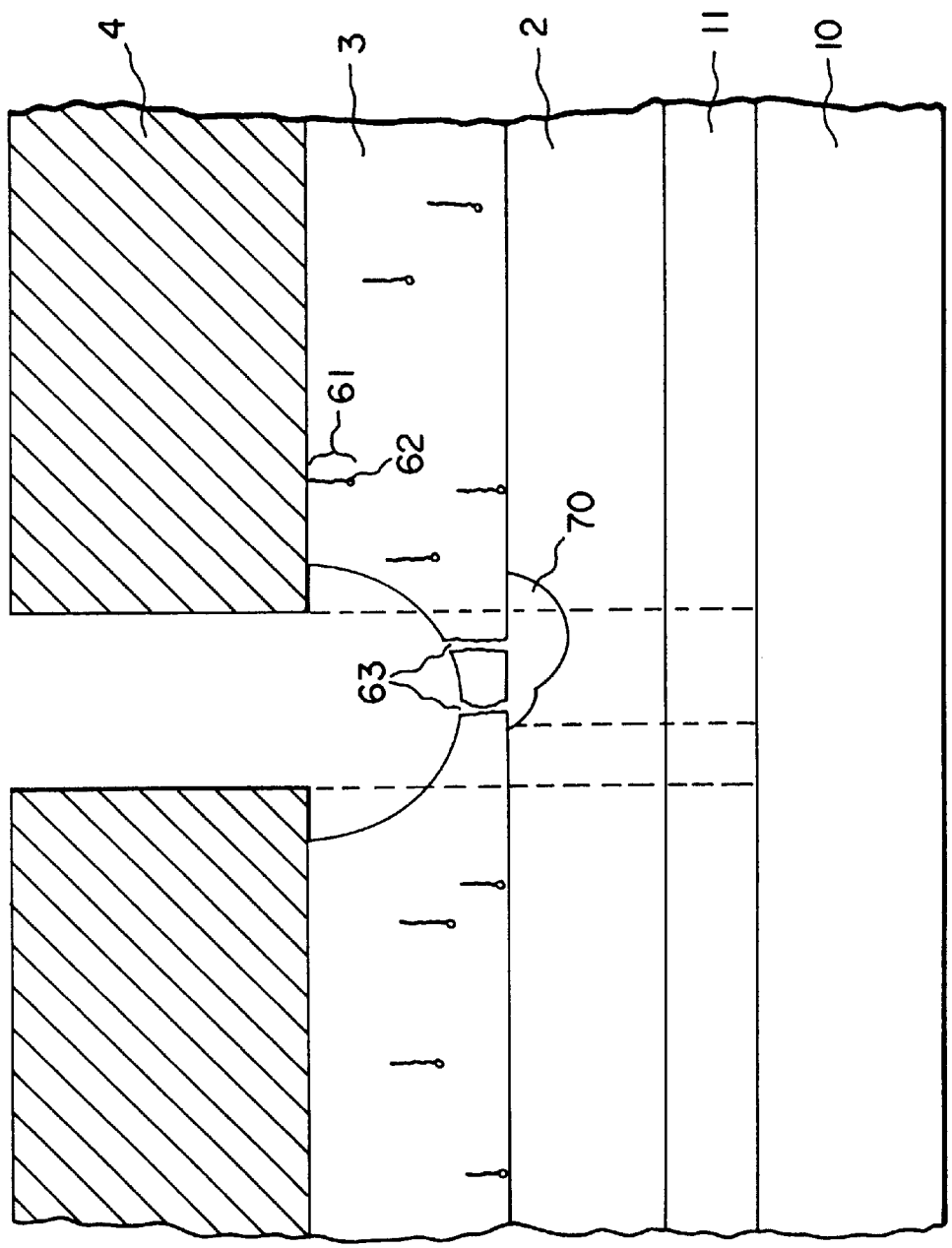
Figure 15:
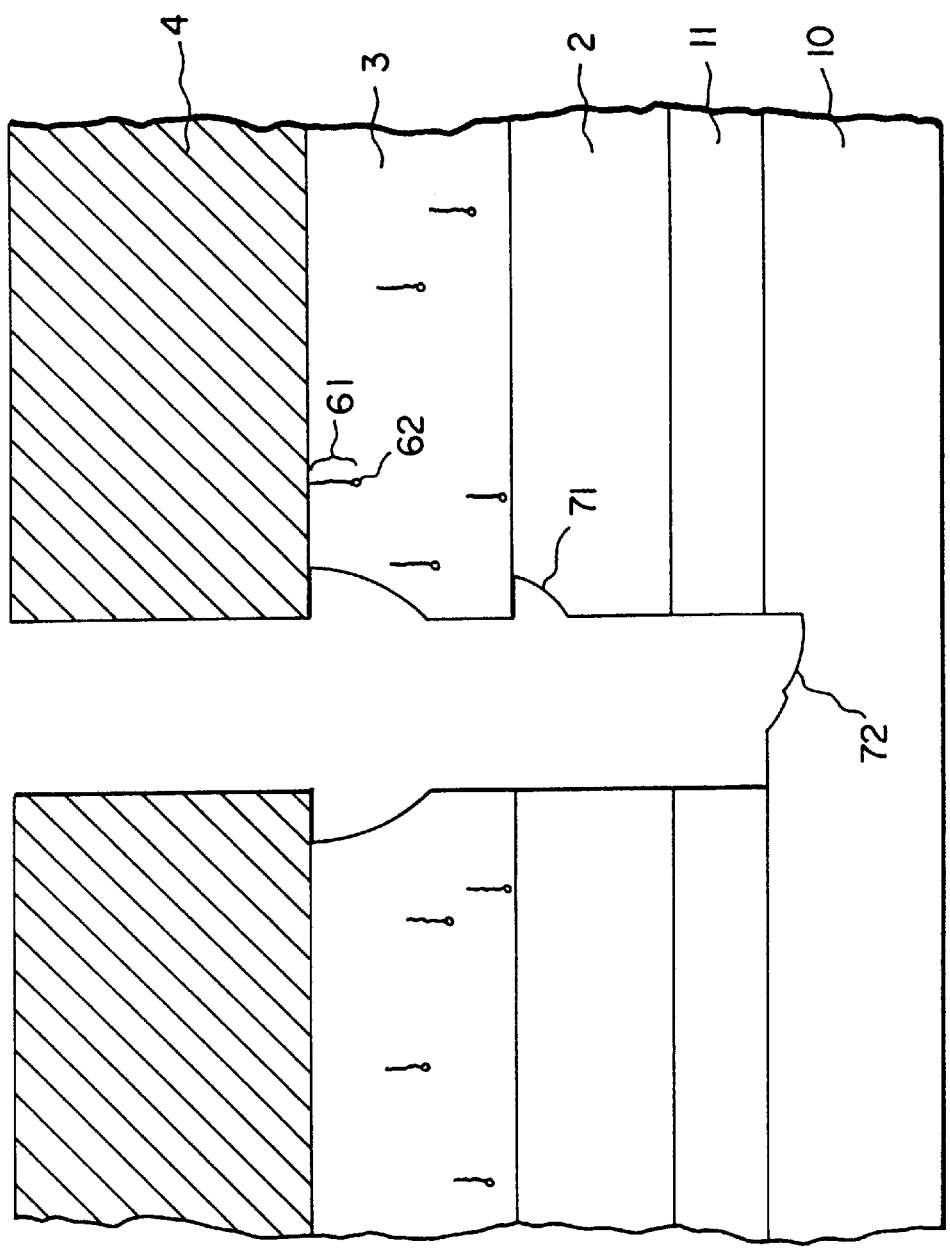
Figure 16:
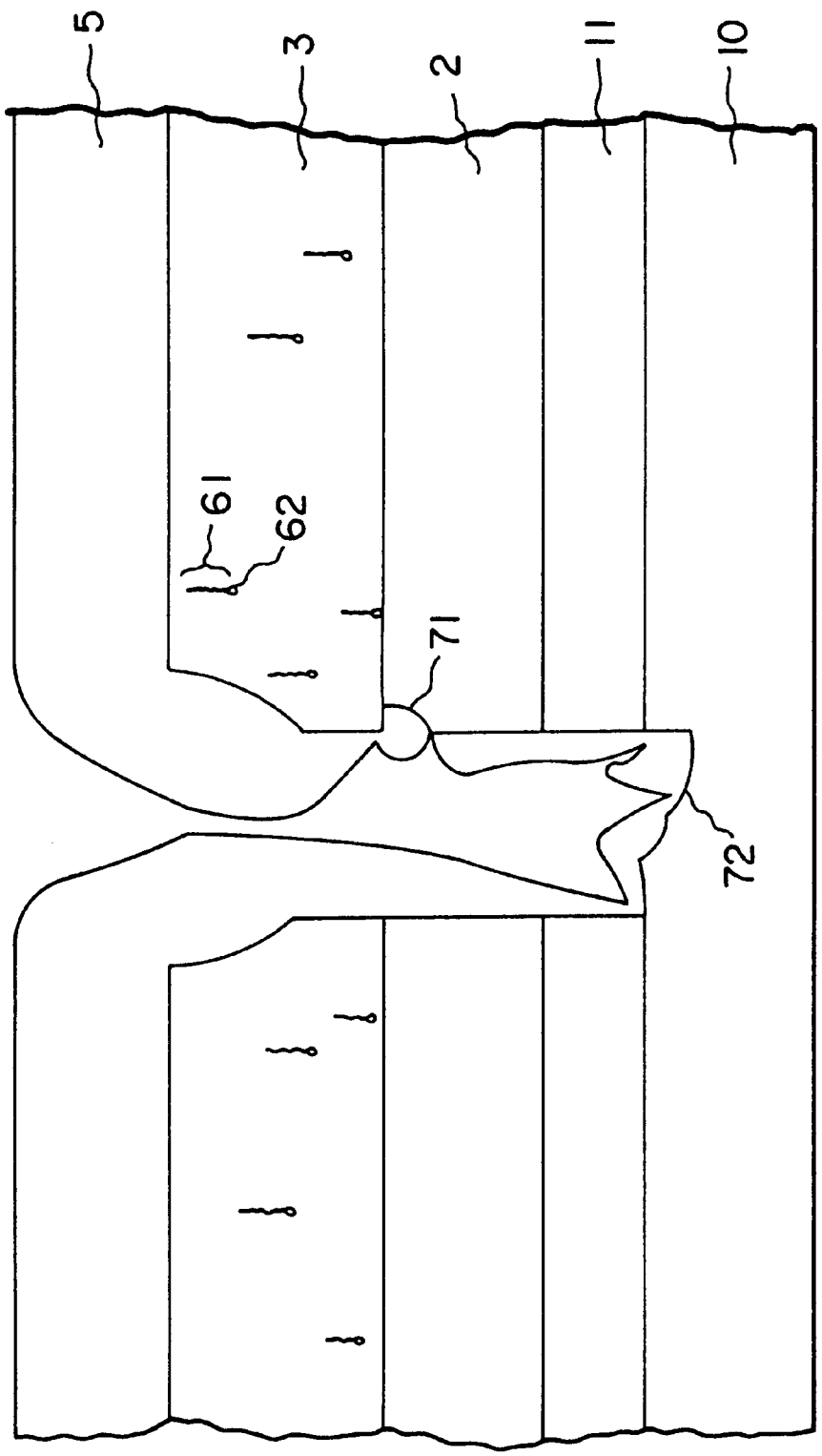
Figure 17:
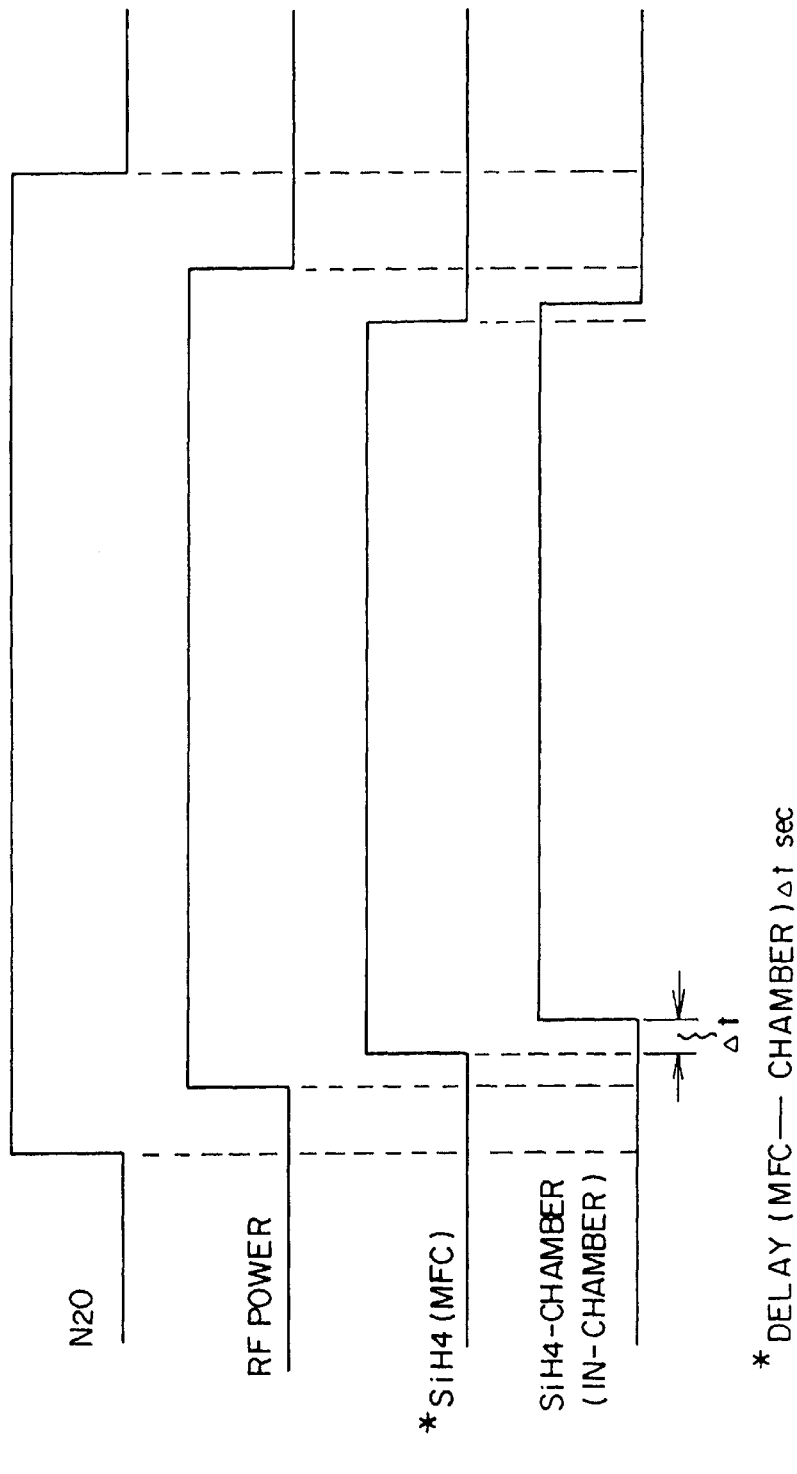
FIG. 17 is a diagram showing timing sequences of four processes according to prior art.

FIG. 12 is a graphical chart depicting the alterations in concentration of various elements with respect to the depth of various impurities (i.e. SIMS depth profiles) in a multilayer insulator substrate according to the present invention (corresponding, for example, to the PE-CVD oxide film 30 in the embodiments described above). The vertical axis represents the concentration (atoms/cc) and secondary ion intensity (cts/sec.). The horizontal axis represents the depth (microns) of the various impurities, including Cl (Chloride), C (Carbon), S (Sulfur), N (Nitrogen), F (Fluorine), and OH (Hydroxide ion), in an inner direction of the multilayer silicon substrate.

The values depicted in FIG. 12 were obtained as follows. Low $SiH_4$ partial pressure results in the deposition rate staying proportional to the $SiH_4$ gas flow rate. As a result, when the gas is cycled off, two events occur. First, the deposition rate drops dramatically. Second, surface migration of adsorbed reactants is enhanced. Adatom rearrangement, i.e. the rearrangement of the unstably existing atoms to be adsorbed onto the surface of the film being grown, due to continuing ion and electron bombardment results in the migration of adsorbed reactants onto stable sites. At the same time, the desorption of reation byproducts (e.g., nitrogen in particular) continues. By the time the $SiH_4$ gas flow returns to the original setpoint, a thin $SiO_2$ film (e.g., 10–15 nm thick) with a higher density and fewer entrapped byproducts, is formed.

As can be seen in FIG. 12, the multiple thin film higher density $SiO_2$ boundary layers in the multilayer PE-CVD oxide film substrate of the present invention are marked by a sharp decrease in the N signal. The drop in the N signal is proportional to the $N_2O$ passivation time (when the $SiH_4$ gas is turned off), five seconds for each of the top three layers and three seconds for each of the remaining two layers, in the multilayer insulator substrate having five total interlayer boundary layers. The corresponding F peaks may have resulted from a chamber cleaning process employing $NF_3$ and $N_2O$ gases, performed between wafer depositions.

While preferred embodiments of the present invention and the benefits thereof were described above, the present invention is not limited to the preferred embodiments described above. For instance, chemicals of different concentrations or different supplying chemicals may be used instead of the sudden cuts in gas flow during the plasma enhanced chemical vapor deposition creation of the interlayer insulator according to the present invention. During the above-described process for fabricating the interlayer insulator according to the present invention, sudden stoppage in gas supply was used to create more dense silicon oxide boundary layers within regular silicon oxide films. The sudden cut in gas supply reduces necessary chemical elements used in film formation, resulting in more precise bonding inside the silicon oxide than would ordinarily occur, leading to more dense silicon oxide layers. However, changing the concentration of the added chemical material may also be used to reduce or prevent defect formation within the produced film or for achieving a more gentle isotropically etched profile. In particular, changing the concentration of nitrogen gas or even changing the type of supplying gas during film formation may be used to achieve similar results.

Moreover, the present invention is not limited to the complete stops in gas supply during fabrication of the interlayer insulator according to the present invention. Sudden reduction in the amount of supplying gas may also be used to achieve similar results.

In addition, the interlayer insulator film according to the present invention is not limited.to plasma enhanced CVD films. If only some of the ingredients are altered, then ordinary CVD film (not a plasma enhanced film) may even be used to achieve the same results.

Furthermore, although a few preferred embodiments of the present invention have been described, it would be appreciated by those skilled in the art that changes may be made in these embodiments without departing from the principles and spirit of the invention, the scope of which is defined in the claims and their equivalents.

What is claimed is:

1. A semiconductor device, comprising:
a substrate having a conductive film;
an insulator layer, formed over said substrate, having an internal boundary layer to prevent elongation of string-like defects across said boundary layer; and
a wiring layer formed over said insulator layer contacting said conductive film of said substrate through said insulator layer,
wherein said insulator layer is made of silicon oxide and nitrogen, and said boundary layer has a lower, non-zero, concentration of nitrogen than a concentration of the nitrogen in other portions of said insulator layer, and
wherein said boundary layer has a thickness of approximately 10–15 nanometers.

2. A semiconductor device as recited in claim 1, wherein said boundary layer has a density greater than a density of said insulator layer.

3. A semiconductor device as recited in claim 1, wherein said boundary layer has a concentration different from a concentration of said insulator layer.

4. A semiconductor device as recited in claim 1, wherein said insulator layer has a step-shaped sloped opening through which said wiring layer contacts said conductive film of said substrate.

5. A semiconductor device, comprising:
a substrate having a conductive film;
an insulator layer, formed over said substrate, having insulator films and boundary layers, each of said boundary layers separating each of said insulator films, said boundary layers having a density greater than a density of said insulator films; and
a wiring layer formed over said insulator layer contacting said conductive film of said substrate through said insulator layer,
wherein said insulator layer is made of silicon oxide and nitrogen, and said boundary layers have a lower, non-zero, concentration of nitrogen than a concentration of nitrogen in said insulator films, and
wherein each of said boundary layers has a thickness of approximately 10–15 nanometers.

6. A semiconductor device as recited in claim 5, wherein said boundary layers have a concentration different from a concentration of said insulator films.

7. A semiconductor device as recited in claim 5, wherein said insulator layer has a step-shaped sloped opening through which said wiring layer contacts said conductive film of said substrate.

8. A semiconductor device comprising:
a substrate having a conductive film;
an insulator layer, formed over said substrate, having insulator films and boundary layers, each of said boundary layers separating each of said insulator films, said boundary layers having a density greater than a density of said insulator films; and
a wiring layer formed over said insulator layer contacting said conductive film of said substrate through said insulator layer,
wherein each of said insulator films has a thickness of tens of nanometers, and
wherein each of said boundary layers has a thickness of approximately 10–15 nm.

9. A semiconductor device comprising:
a substrate having a conductive film;
an insulator layer, formed over said substrate, having insulator films and boundary layers, each of said boundary layers separating each of said insulator films said boundary layers having a density greater than a density of said insulator films; and
a wiring layer formed over said insulator layer contacting said conductive film of said substrate through said insulator layer,
wherein said insulator films and said boundary layers of said insulator layer are grouped between upper and lower insulator films and boundary layers, said upper insulator films having a greater thickness than said lower insulator films, and said upper insulator films and said upper boundary layers form a step-shaped sloped opening through which said wiring layer contacts said conductive film of said substrate.

10. A semiconductor device, comprising:
a substrate having a conductive film;
an insulator layer of a substantially uniform chemical composition, formed over said substrate, having at least one internal boundary layer, which is greater in density or lower in concentration of an impurity relative to another portion of said insulator layer, and at least one string-like defect extending to and impeded by said boundary layer; and
a wiring layer formed over said insulator layer contacting said conductive film of said substrate through said insulator layer via an opening
wherein said at least one boundary layer has a thickness of approximately 10–15 nanometers.

11. A semiconductor device comprising:
a substrate having a conductive film;
an insulator layer, formed over said substrate, having insulator films and boundary layers, each of said boundary layers separating each of said insulator films, said boundary layers having a concentration of an impurity lower than a concentration of the impurity in said insulator films; and
a wiring layer formed over said insulator layer contacting said conductive film of said substrate through said insulator layer,
wherein each of said insulator films has a thickness of tens of nanometers, and
wherein each of said boundary layers has a thickness of approximately 10–15 nm.

* * * * *